United States Patent
Koyama et al.

(10) Patent No.: US 8,086,198 B2
(45) Date of Patent: Dec. 27, 2011

(54) RADIO BROADCASTING RECEIVER AND METHOD FOR SEEKING RADIO BROADCASTING

(75) Inventors: Kazuo Koyama, Hasuda (JP); Masanori Ishida, Ageo (JP); Kazuyoshi Inako, Saitama (JP); Naoki Nakajima, Tokyo (JP)

(73) Assignee: Clarion Co., Ltd., Tokyo (JP)

( * ) Notice: Subject to any disclaimer, the term of this patent is extended or adjusted under 35 U.S.C. 154(b) by 79 days.

(21) Appl. No.: 12/310,596

(22) PCT Filed: Aug. 30, 2007

(86) PCT No.: PCT/JP2007/066902
§ 371 (c)(1),
(2), (4) Date: Feb. 27, 2009

(87) PCT Pub. No.: WO2008/026695
PCT Pub. Date: Mar. 6, 2008

(65) Prior Publication Data
US 2010/0227579 A1 Sep. 9, 2010

(30) Foreign Application Priority Data
Sep. 1, 2006 (JP) .................................. 2006-238105

(51) Int. Cl.
*H04B 1/18* (2006.01)

(52) U.S. Cl. .................................. 455/179.1; 455/166.2
(58) Field of Classification Search .................. None
See application file for complete search history.

(56) References Cited

U.S. PATENT DOCUMENTS
7,567,302 B2 * 7/2009 Tachiwa .................. 348/725
2010/0060786 A1 * 3/2010 Kim et al. ................ 348/463

FOREIGN PATENT DOCUMENTS
JP 11-164214 6/1999
JP 2005-12593 1/2005
* cited by examiner

*Primary Examiner* — An Luu
(74) *Attorney, Agent, or Firm* — Day Pitney LLP

(57) ABSTRACT

A broadcasting receiver suitable for receiving a broadcasting signal transmitted in an IBOC signal format, comprises: a channel seek directing means for directing to start a channel seeking operation that selects selectable channel in an order of frequency; a channel seek controlling means for starting and controlling the channel seeking operation in accordance with the direction of the channel seek directing means; and a multichannel determining means for determining whether a selected frequency channel is providing multichannel digital broadcasting or not; and wherein the channel seek controlling means selects a next subchannel in an order of identification code before searching for the next frequency channel, if it is determined by the multichannel determining means that the selected frequency channel is providing the multichannel digital broadcasting.

10 Claims, 3 Drawing Sheets

RADIO BROADCASTING RECEIVER AND METHOD FOR SEEKING RADIO BROADCASTING

FIELD OF THE INVENTION

Figure 1:
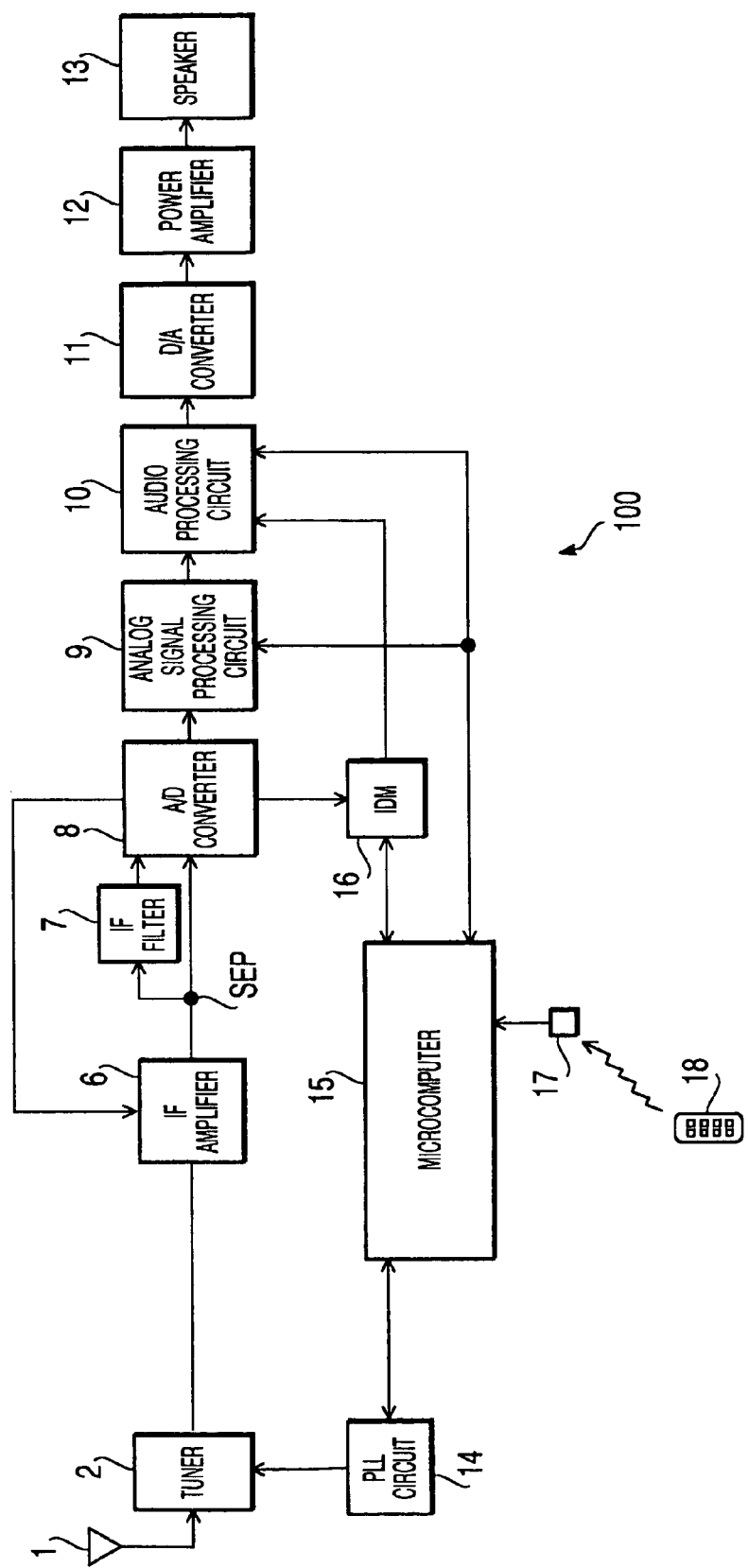

The present invention relates to a radio broadcasting receiver and a method for seeking channel that searches for and selects receivable channels.

BACKGROUND OF THE ART

Recently, it has become popular to process and manage the sound and video in digital format in appliances such as acoustic appliances and video appliances. Such trends in digital encoding of sound and video in appliances such as acoustic appliances are extending to the field of radio broadcasting. For example, in the United States, a digital radio broadcasting system called IBOC (In Band On Channel) is proposed and made available by iBiquity Digital Corp.

Meanwhile, conventional analog radio broadcasting broadcasts via carrier wave (hereinafter referred to as "analog carrier wave") that has frequency distribution inside the frequency band (hereinafter referred to as "channel" or "frequency channel") assigned to individual broadcasting stations. Actually, in order to avoid the interference between analog carrier wave of adjacent channels, only the center portion of the assigned band is used for the transmission of the analog carrier wave, and other portions are not used. It is noted that "digital radio broadcasting" in this application means "IBOC digital radio broadcasting".

IBOC is a type of digital radio broadcasting that uses frequency channel assigned to the conventional analog radio broadcasting. In IBOC standard, a plurality of signal formats are defined, such as hybrid format in which the digital radio broadcasting signal is multiplexed onto the conventional analog radio broadcasting signal, and all-digital format consisted of only digital signals, and it is designed to gradually transfer from conventional analog radio broadcasting to all-digital radio broadcasting that has many functions and is high in quality. In the IBOC, digital broadcasting signals are transmitted with Orthogonal Frequency Division Multiplexing (OFDM) that uses many carrier waves (subcarriers).

In the IBOC standard, signal format called "hybrid format" is used in the transition period from analog broadcasting to all-digital broadcasting. In the hybrid format, the digital radio broadcasting, which allocates the subcarrier of digital broadcasting in the portion that is adjacent to the center portion of the frequency channel that the analog carrier wave uses and that was not conventionally used (Hereinafter referred to as "sideband") is broadcast using the modulated wave of the sideband of the band. In other words, in accordance with the hybrid format of the IBOC, the band for frequency channel assigned for the conventional analog radio broadcasting is utilized effectively, and the analog radio broadcasting and the digital radio broadcasting are simultaneously transmitted using a same channel. It is noted that, depending on the frequency channel, a plurality of subchannels (programs) may be transmitted using a plurality of logic channels for the digital radio broadcasting. In the following, the channel that includes a plurality of subchannels in a single frequency channel is referred to as "multichannel". Further, "digital, radio broadcasting" means "IBOC digital radio broadcasting" in this application.

For example, Japanese Patent Provisional Publication No. JP2005-12593 A1 (hereinafter referred to as "the Reference Document") discloses an IBOC broadcasting receiver that is capable of receiving such IBOC digital radio broadcasting. The IBOC broadcasting receiver disclosed in the Reference Document is provided with automatic seeking function for seeking a receivable channel.

The IBOC broadcasting receiver starts the channel seeking operation when a predetermined user operation (e.g., pressing down once the "tuning-up" or "tuning-down" button equipped at the operation Panel) is performed, and the receiving intensity of the seeking frequency channel is detected. Then, based on the detected result, it determines whether frequency channel is station-existent (i.e., a state where a broadcasting station is found) or not, and if it determined that it is station-existent, it determines whether the digital radio broadcasting is transmitted in the frequency channel or not. Then, if it determined that the digital radio broadcasting is being transmitted, the seeking operation is stopped with the frequency channel being selected, and the digital radio broadcasting of the selected frequency channel is played. Further, if it determined that the digital radio broadcasting is not being transmitted, similar process is performed on the next seeking frequency channel. This process is repeatedly performed until digital radio broadcasting is performed the seek.

DISCLOSURE OF THE INVENTION

The IBOC broadcasting receiver described in the Reference Document has an arrangement that performs the seeking operation in frequency channel basis. Therefore, in order to listen to the desired subchannel in the multichannel, the user first need to perform user operation so that it transfers to a mode for selecting a subchannel. However, such an operation is very complicated for the user. Further, in order to be able to transfer into such a mode, for example, the IBOC broadcasting receiver need to be provided with a special button. But this is not preferable since it results in disadvantages such as increases in cost and decreases in design flexibility. As an alternative way to resolve this, for example, the IBOC broadcasting receiver may be arranged such that it is able to transfer into the above-described mode by pushing and holding the button for automatic seeking long. However, this is not preferable since it increases the operation load of the user although it can avoid the increases in cost and the decreases in design flexibility, etc.

Thus, in view of the above circumstances, it is an object of the present invention to provide a radio broadcasting receiver and a method for seeking radio broadcasting, which is capable of performing the seek for station-existent and the selection of subchannel.

In accordance with the embodiment of the invention, a broadcasting receiver suitable for receiving a broadcasting signal transmitted in an IBOC signal format is provided, which comprises: a channel seek directing means for directing to start a channel seeking operation that selects a selectable channel in an order of frequency; a channel seek controlling means for starting and controlling the channel seeking operation in accordance with the direction of the channel seek directing means; and a multichannel determining means for determining whether a selected frequency channel is providing multichannel digital broadcasting or not. In the broadcasting receiver according to this embodiment, the channel seek controlling means may select a next subchannel in an order of identification code before searching for a next frequency channel, if it is determined by the multichannel determining means that the selected frequency channel is providing the multichannel digital broadcasting.

In accordance with the broadcasting receiver so arranged, it is able to perform the seeking operation of the frequency channel and the seeking operation for the subchannel of the digital broadcasting with the same direction operation, and thereby, the direction for channel seek is able to be done more easily.

Preferably, the channel seek controlling means controls the channel seeking operation such that unidirectional seek for the subchannel is performed. With such an arrangement, upon performing channel seek from the subchannel with the last identification code in the seeking direction, the seek moves to the next frequency channel automatically, and thereby, the seek direction becomes easier. In addition, the user can understand the channel seeking operation easily in a natural sense and the usability is improved.

Preferably, the channel seek controlling means controls the channel seeking operation such that cyclic seek for the frequency channel is performed. With such an arrangement, it is able to seek all of the frequency channel with only a direction for channel seek of one direction, and thereby, it is able to perform the direction for channel seek easily. Further, since the frequency channel not yet selected is performed the seek, seeking in opposite direction and seeking again the frequency channel already selected are not needed, and thereby, it is able to perform the channel seek effectively.

Preferably, the channel seek controlling means searches for a next frequency channel in ascending order of the frequency and searches for a next subchannel in ascending order of the identification code if the channel seek directing means directed tuning-up, and selects next frequency channel in descending order of the frequency and selects next subchannel in descending order of identification code if the channel seek directing means directed down-seeking With such an arrangement, the user can understand the channel seeking operation easily in a natural sense and the usability is improved.

Optionally, the channel seek directing means may be a inputting button for transmitting direction signal in response to user operation. With such an arrangement, the user can seek all the channels just by manipulating the single inputting button (or one for each seeking direction).

Optionally, the broadcasting receiver according to the embodiment is capable of being mounted in a mobile body.

Further, a method for performing a channel seeking operation, which searches for and selects a selectable channel in a frequency range including a channel that transmits in an IBOC signal format is provided, which comprises: a channel seek directing step for directing to start the channel seeking operation that selects a selectable channel in an order of frequency; a channel seek controlling step for starting and controlling the channel seeking operation in accordance with the direction in the channel seek directing step; and a multichannel determining step for determining whether the selecting frequency channel is providing multichannel digital broadcasting or not. In the channel seek controlling step of this method, the channel seeking operation may be controlled such that the next subchannel is selected in an order of identification code before searching for the next frequency channel, if it is determined in the multichannel determining step that the selecting frequency channel is providing the multichannel digital broadcasting.

Preferably, in the channel seek controlling step, the channel seeking operation is controlled such that unidirectional seek for the subchannel is performed, and the channel seeking operation is controlled such that cyclic seek for the frequency channel is performed.

In the channel seek controlling step, the channel seeking operation is controlled such that next frequency channel is searched for in ascending order of the frequency and next subchannel is searched for in ascending order of identification code if tuning-up is directed in the channel seek directing step, and next frequency channel is selected in descending order of the frequency and next subchannel is selected in descending order of identification code if down-seeking is directed in the channel seek directing step.

BRIEF DESCRIPTION OF ACCOMPANYING DRAWINGS

FIG. 1 A block diagram showing an arrangement of an audio apparatus comprising an IBOC broadcasting receiver according to an embodiment of the invention.

Figure 2:
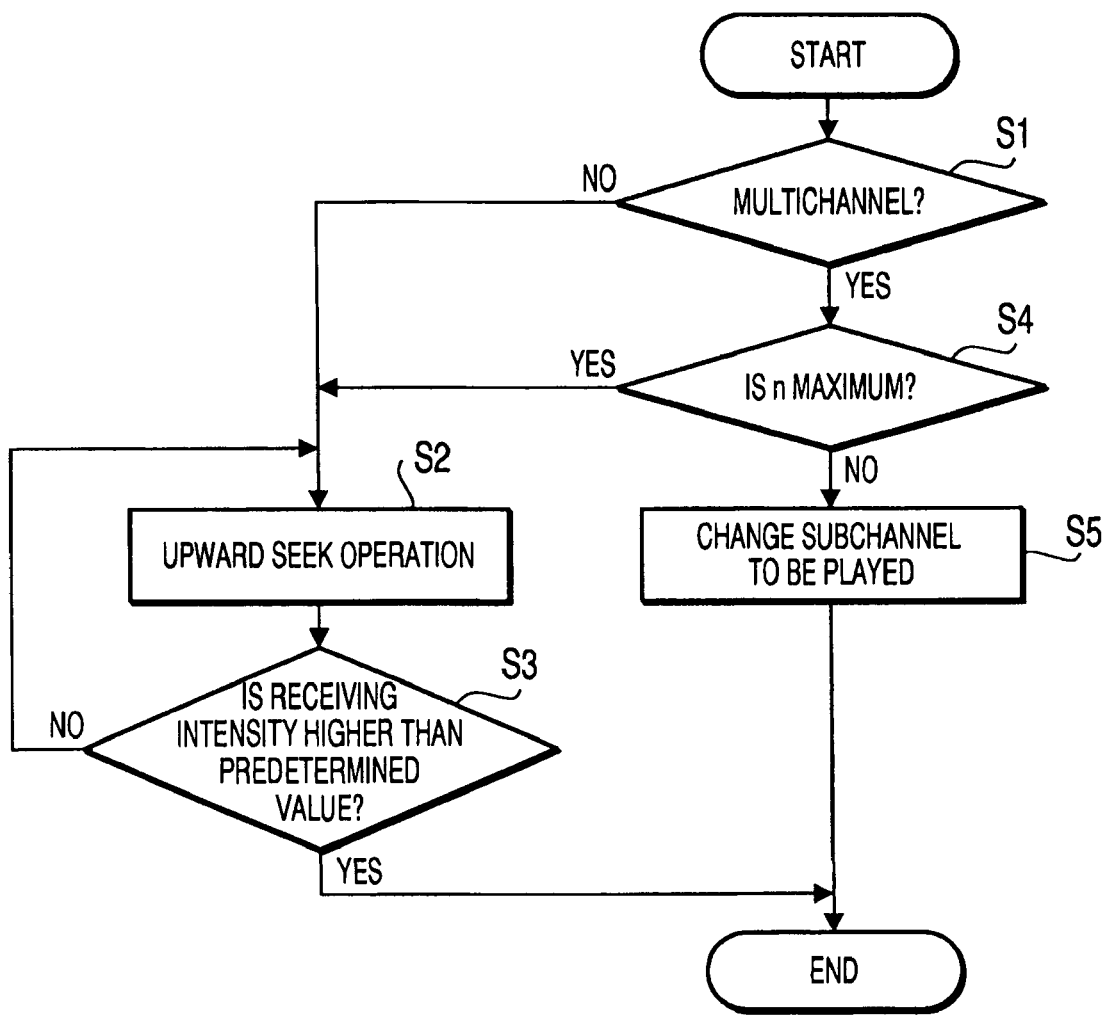

FIG. 2 A flowchart describing channel seeking process performed in the audio apparatus according to the embodiment of the invention.

Figure 3:
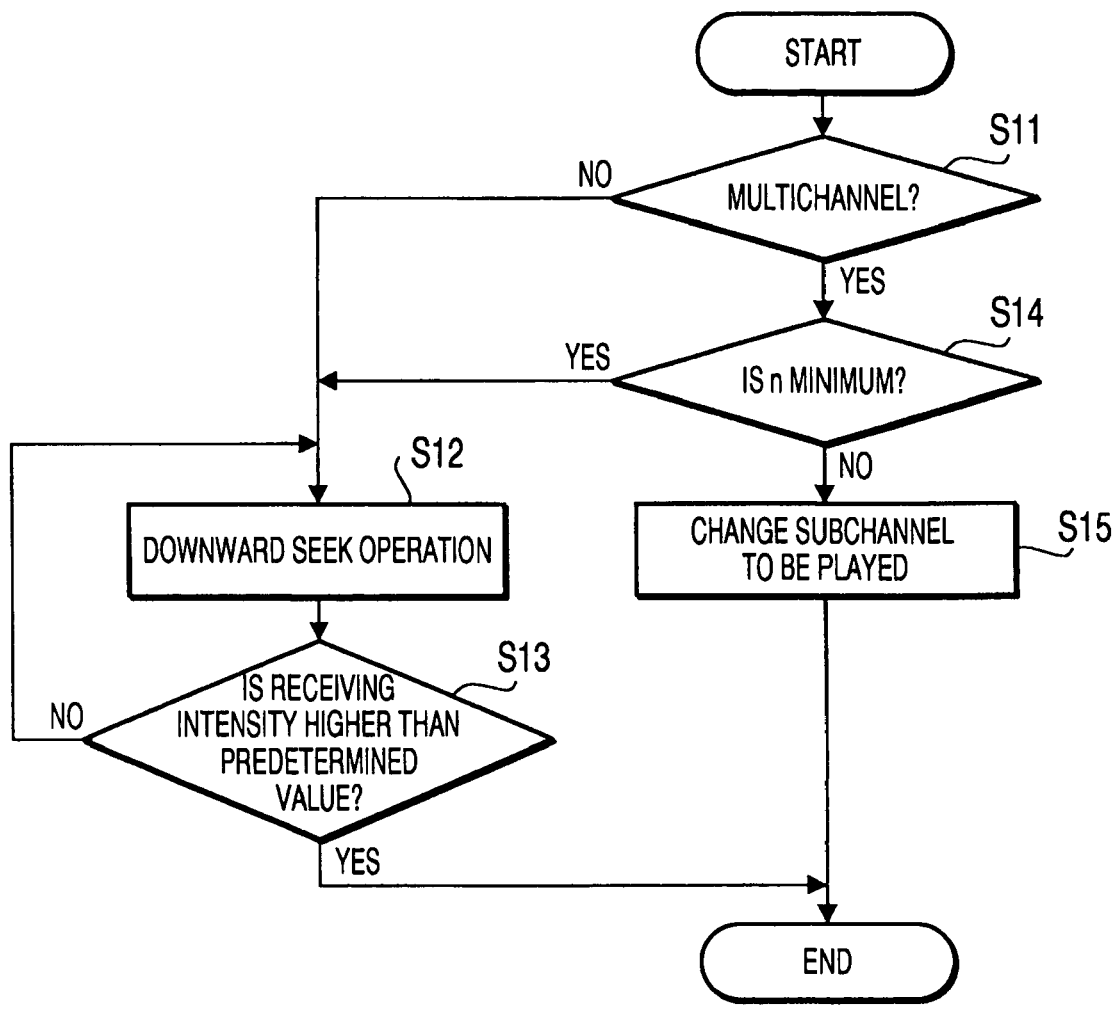

FIG. 3 A flowchart describing channel seeking process performed in the audio apparatus according to another embodiment of the invention.

DETAILED DESCRIPTION OF PREFERRED EMBODIMENTS

In the following, an arrangement and functions of an IBOC broadcasting receiver according an embodiment of the invention will be described referring to the drawings.

FIG. 1 is a block diagram illustrating an arrangement of an audio apparatus 100 including an IBOC broadcasting receiver according to an embodiment of the present invention. The audio apparatus 100 is mounted in, for example, a mobile vehicle. The audio apparatus 100 complies with IBOC radio broadcasting, and is designed to receive and process broadcasting signal in IBOC signal format.

The audio apparatus 100 includes an antenna 1, a tuner 2, an IF (Intermediate Frequency) amplifier 6, a separator SEP, an IF filter 7, an A/D converter 8, an analog signal processing circuit 9, an audio processing circuit 10, a D/A converter 11, a power amplifier 12, a speaker 13, a PLL (Phase Locked Loop) circuit 14, a microcomputer 15, an IDM (IBOC Digital Module) 16, an optical receiver 17, and a remote controller 18.

The remote controller 18 is provided with operation keys for operating the audio apparatus 100. When the user operates the remote controller 18, a control pulse associated with the operation is output from the remote controller 18. Such control pulse output is, for example, a signal that complies with the IrDA standard. After the optical receiver 17 receives the control pulse that the remote controller 18 outputted, then passes it to the microcomputer 15.

The microcomputer 15 governs the general control of the overall audio apparatus 100 and is implemented with control programs. Then, it executes those programs based on the control pulse received from the optical receiver 17, and controls elements within the audio apparatus 100.

In the following, a series of signal processing in the audio apparatus 100 will be described.

The antenna 1 receives RF (Radio Frequency) signal for channels of the radio broadcast. RF signal received on the antenna 1 is input to the tuner 2.

The tuner 2 performs the frequency conversion by selecting the RF signal of the desired station among the input RF signals with the control carried out by the microcomputer 15 with the PLL circuit 14. Specifically, it converts into an intermediate frequency, i.e., IF signal, which the operation stability and the selection characteristics are improved. The IF signal that underwent the frequency conversion is input to the IF amplifier 6. Further, the tuner 2 outputs information showing the intensity of the IF signal (hereinafter referred to as "received intensity value") to the microcomputer 15. It is noted that the above-described "desired channel" is determined according to, for example, the station selecting manipulation by the user. The information regarding the last selected channel (hereinafter referred to as "last channel") is, for example, held in the internal memory or a flash ROM (not shown) of the microcomputer 15.

The IF amplifier 6 amplifies the input IF signal and outputs to the separator SEP. The separator SEP separates the input IF signal into two signal components based on, for example, the frequency. One is a signal component obtained by converting the analog carrier wave into the IF signal (hereinafter referred to as "analog IF signal"), and the other one is a signal component obtained by converting the sideband subcarrier into the IF signal (hereinafter referred to as "digital IF signal"). The separator SEP outputs the analog IF signal and the digital IF signal obtained by the separation, to the IF filter 7 and the A/D converter 8, respectively.

If only the analog radio broadcasting is transmitted in the desired channel, substantially only the analog IF signal is input to the separator SEP. Therefore, the digital IF signal will not be obtained even if the separation process is performed at the separator SEP. In contrast, if only the digital radio broadcasting is transmitted in the desired station, substantially only the digital IF signal is input to the separator SEP. Therefore, the analog IF signal will not be obtained even if the separation process is performed at the separator SEP.

The IF filter 7 performs the filtering process that removes' the unneeded frequency component from the input analog IF signal, and outputs to the A/D converter 8. The A/D converter 8 is provided with different A/D conversion processing circuits individually for analog IF signal and for digital IF signal. Then, the input analog and digital IF signal is A/D converted by the corresponding A/D conversion processing circuit. The A/D converter 8 outputs each of the A/D converted analog IF signal and digital signal to the analog signal processing circuit 9 and the IDM 16, respectively. It is noted that the gain of the IF amplifier 6 is adjusted with the feedback control based on the level of the IF signal input to the A/D converter 8.

The analog signal processing circuit 9 includes a detection circuit for detecting the analog IF signal, a noise canceller, and a weak electric field processing circuit. The analog IF signal input to the analog signal processing circuit 9 is decoded to the audio signal by the detection circuit. Then, the noise canceller removes the noise. After the removal of the noise, the weak electric field processing circuit performs processes that correspond to the receiving status of the desired station (e.g., mute, high cut, and separation control). Then, after these series of processes, it is output to the audio processing circuit 10. For the purpose of description, the audio signal that underwent the processing of the analog signal processing circuit 9 and was output is referred to as "analog audio signal".

The IDM 16 performs a well-known decoding process to the input digital IF signal and acquires audio signal. Then, the acquired audio signal is output to the audio processing circuit 10. For the purpose of description, the audio signal that underwent the IDM 16 process and was output is referred to as "digital audio signal". Further, if the desired station is a multichannel, the IDM 16 acquires with the decoding process a plurality of groups of digital audio signal that corresponds to each of the subchannels. Then, it outputs to the audio processing circuit 10 the digital audio signal for either one of the subchannels selected by, for example, user operation.

Subsequently, the audio processing circuit 10 performs a predetermined process to the input audio signal and outputs to the volume circuit (not described). Such audio signal is volume-controlled at the volume circuit, and then input to the D/A converter 11. It is noted that if both the analog audio signal and the digital audio signal are input, the audio processing circuit 10 outputs either one of them. In addition, in the initial setting, the digital audio signal is given priority to be output. For example, when the input signal is changed from only analog audio signal to both analog and digital audio signal, the audio processing circuit 10 operates to output the digital audio signal.

The D/A converter 11 performs a digital-to-analog conversion to the input audio signal and outputs to the power amplifier 12. The power amplifier 12 amplifies the audio signal and outputs to the speaker 13. Thereby, the radio broadcast is played at the speaker 13. It is noted that the audio processing circuit 10 is implemented with a blend circuit that smoothly switches between the input analog audio signal and digital audio signal and outputs either one of them. With the blend circuit, when the output signal is switched from analog audio signal to digital audio signal (or alternatively, from digital audio signal to analog audio signal), the sound output from the speaker 13 is coupled naturally so that the user does not sense the switch occurred.

In the following, the seeking operation in the audio apparatus 100 according to the present embodiment of the invention will be described. FIG. 2 shows a flowchart of the seeking process in the audio apparatus 100. It is noted that, the seeking process of FIG. 2 starts when the user performed a tuning-up manipulation (e.g., pressing once the "tuning-up" button equipped in the remote controller 18), for example, in a situation where either of the channels is being selected.

Upon the seeking process according to the present embodiment starts, the microcomputer 15 refers to the result of the decoding by the IDM 16, and determines whether the selected channel is a multichannel or not (Step 1; Hereinafter, "Step" is abbreviated as "S" in this application).

In the S1 process, the microcomputer 15 determines that the selected channel is not a multichannel if the result of the decoding by the IDM 16 could not be obtained or the obtained decoding result was digital audio signal with one subchannel (S1: NO). Then, it performs upward (i.e., increasing the seeking frequency channel to higher frequency channel than the current desired station.) channel seeking operation, and seeks the frequency channel with the receiving intensity value higher than a predetermined value (S2, S3).

When the frequency channel with the receiving intensity value higher than the predetermined value is performed the seek in the S2 and S3 channel seeking operation (S3: YES), it means that a radio broadcasting that is capable of playing with clear sound quality is on the air in the frequency channel. Therefore, the microcomputer 15 stops the seeking operation and ends the process of this flowchart with the frequency channel being selected. Thereby, the radio broadcasting for the frequency channel is played at the speaker 13. That is, the user is able to listen to the radio broadcasting for another frequency channel by performing the tuning-up operation.

If the station-existent frequency channel is not detected in the S2 and S3 processes and it has reached the upper limit of the seeking range, it moves the next seeking frequency to the lower limit of the range, and then, the upward seeking operation is performed again. Such a method, which moves the seeking frequency channel from the upper limit to the lower limit or from the lower limit from the upper limit and continuing the channel seek in one direction is herein referred to as "cyclic seeking". When a station-existent frequency channel could not be detected in all the frequency band in the seeking range, the microcomputer 15 stops the channel seek and ends the process of the flowchart with the channel before the seeking process being selected. It is noted that, even though no station-existent frequency channel could be selected in all the frequency band in the seeking range, it may continue the channel seeking operation. With such an arrangement, advantageously, the station-existent may be performed the seek, for example, when the receiving condition had been improved.

In the S1 process, the microcomputer 15 determines that the selected channel is a multichannel when it refers to the decoding result by the IDM 16 and detected the digital audio signal for a plurality of subchannels (S1: YES). Then, it determines whether the ID ("identification code n" herein) assigned to the subchannel that is being output to the speaker 13 has the largest value among the subchannels in the multichannel or not (S4). If the selected frequency channel transmits three subchannels, we assume herein that identification codes "1", "2" and "3" are assigned to each of the subchannels. Therefore, in the S4 process, it is determined whether the identification code for the subchannel that is being output to the speaker 13 is "3" or not. It is noted that, the subchannel assigned "1" is herein referred to as the "main channel for the digital radio broadcasting".

If the microcomputer 15 determined that the identification code n for the subchannel being output has maximum value (S4: YES), the upward seeking operation of S2 and S3 is performed. If a station-existent frequency channel is detected, as with the descriptions for the above-described S2 and S3 processes, the user is able to listen to the radio broadcasting for the detected frequency channel. On the other hand, if it determined that the identification code n for the subchannel being output does not have maximum value (S4: NO), IDM 16 is controlled to output the digital audio signal for the subchannel with identification code n+1 (e.g., "3" if the identification code for the subchannel currently being output is "2") (S5) and ends the process of the flowchart. Thereby, the radio broadcasting that is at the same frequency channel as the previous time and that has subchannel identification code n+1 is selected and played at the speaker 13. In other words, by performing the tuning-up manipulation, the user can listen to a different subchannel in the same frequency channel.

As described above, in the selection of the subchannels, the process corresponding to the cyclic seek of the frequency channel, i.e., the process that puts the identification code for the selecting subchannel back from the maximum value "3" to the minimum value "1", is not performed and when the tuning-up (or tuning-down) is directed while selecting the subchannel with the maximum (or minimum) identification code value, the process for moving the seeking frequency channel to the next frequency channel is performed. Such a process is herein referred to as "unidirectional seeking".

It is noted that, if the frequency channel detected in the S3 process is a multichannel, the microcomputer 15 controls the IDM 16 so that the digital audio signal for the main channel among the subchannels of the frequency channel is output to the audio processing circuit 10. Thereby, the digital radio broadcasting for the main channel among the subchannels of the detected channel is played at the speaker 13.

That is, the audio apparatus 100 of the present embodiment determines whether the current selected channel (or the channel selected by the channel seek) is a multichannel, and if it is a multichannel, in accordance with the current selecting subchannel, it performs either the seeking process for another frequency channel or the selecting process for the subchannel in the multichannel. In other words, since the audio apparatus 100 determines the switching between the seeking process for the station-existent frequency channel and the selecting process for the subchannel, the user does not need to perform these manipulations concentrating on them. In accordance with the embodiment, by manipulating the tuning-up to listen to another radio broadcasting, the user is able to make the audio apparatus 100 perform the seek process for station-existent frequency channel and the selecting process for the subchannel. In accordance with another aspect of the invention, the user does not need to perform operations like transferring to a mode for selecting a subchannel of a multichannel or returning from such mode. Thereby, the operation load of the user is lessened. Further, since there is no need to provide additional special button for transferring to such a mode, the problem of increasing cost and decreasing of flexibility in designs is resolved.

The embodiments of the present invention are described in the above. The present invention is not limited only to these embodiments but can be changed in various ranges. For example, although the audio apparatus 100 comprising the IBOC broadcasting receiver of the present embodiment is equipped in a vehicle, it may be a portable appliance that a person can carry in other embodiments.

FIG. 3 is a flowchart showing the seeking process in the audio apparatus 100 of another embodiment of the invention. When the seeking process of FIG. 3 starts, as is with the S1 process in FIG. 2, the microcomputer 15 determines whether the selected channel is a multichannel (S11). Then, if it is determined that the selected channel is not a multichannel (S11: NO), downward seeking operation (i.e., decreasing the seeking frequency channel lower than the current selected channel) is performed and the frequency channel with receiving intensity value higher than a predetermined value is performed the seek (S12, S13). If the frequency channel with the receiving intensity value higher than the predetermined value is performed the seek (S13: YES), the channel seeking operation is stopped and the process of the flowchart ends with the frequency channel (channel) selected. Thereby, the radio broadcasting of the channel is played at the speaker 13. The user is also able to listen to the radio broadcasting for another channel by performing the tuning-up operations in this embodiment.

If no station-existent frequency channel is detected in the S12 and S13 processes and the seeking frequency channel has reached the lower limit of the channel seeking range, the frequency band for the upper limit of the range becomes the next seeking frequency channel, and the downward seeking operation is performed again thereafter. If the station-existent frequency band is not performed the seek in all of the frequency bands in the seeking range, the microcomputer 15 stops the seeking operation and ends the process of the flowchart with the channel before the seeking process selected. As described above, alternatively, the seeking operation may be continued even if the station-existent frequency channel has not been performed the seek in all the frequency band in the seeking range. According to such an arrangement, advantageously, it may be able to find a station-existent frequency channel, for example, when the receiving condition has improved.

In the S11 process, if it is determined that the selected channel is a multichannel (S11: YES), the microcomputer 15 determines whether the ID assigned to a subchannel of the multichannel that is output to the speaker 13 has the smallest value among the subchannels of the multichannel (S14). For example, if the desired station transmits three subchannels, we assume that identification codes, "1", "2" and "3" are assigned to the subchannels, as described above. Therefore, in the S14 process, it is determined whether the identification code for the subchannel that is output to the speaker 13 is "1".

In the S14 process, if the identification code n for the subchannel being output is the smallest (S14: YES), the downward seeking operation of S12 and S13 is performed. Then, if the station-existent channel is selected, as with the above-described S12 and S13 processes, the user is able to listen to the radio broadcasting for the selected channels. On the other hand, if it is determined in the S14 process that the identification code n for the subchannel being output is not the smallest (S14: NO), the IDM 16 is controlled to output the digital audio signal for the subchannel with identification code n−1 (e.g., "2" if the identification code for the subchannel currently being output is "3") to the audio processing circuit 10 (S15) and the process of the flowchart ends. Thereby, the radio broadcasting for the subchannel identification code n−1 in the same channel as the previous time is being selected and played at the speaker 13. That is, the user is able to listen to different subchannel in the same channel by performing the tuning-up operation.

If the channel performed the seek in the S13 process is a multichannel, the microcomputer 15 controls the IDM 16 so that the digital audio signal for the main channel among the subchannels of the channel is output to the audio processing circuit 10. Thereby, the digital radio broadcasting for the main channel among the subchannel of the channel being performed the seek is played at the speaker 13.

In the seeking process of the above embodiment, the seek for station-existent station is executed by clicking the "tuning-up" button once. However, it is also possible to manually execute the seek for station-existent frequency channel in yet another embodiment. In such cases, each time the "tuning-up" (or "tuning-down") button is pressed, the frequency band for which the seek is performed changes to the frequency that is increased (or decreased) by 0.1 MHz. When a multichannel is being selected, the subchannel that is displayed and played can be changed to a different subchannel in the same channel by pressing the above-mentioned button. In this case, as the seek process for station-existent frequency channel and the subchannel selection process can be executed by the same operation, a result similar to the above embodiment can also be obtained.

What is claimed is:

1. A broadcasting receiver suitable for receiving a broadcasting signal transmitted in an IBOC signal format, comprising:
   a channel seek directing unit that directs to start a channel seeking operation that selects a selectable channel in an order of frequency;
   a channel seek controlling unit that starts and controls the channel seeking operation in accordance with the direction of the channel seek directing unit; and
   a multichannel determining unit for determining whether a selected frequency channel is providing multichannel digital broadcasting or not,
   wherein the channel seek controlling unit selects a next subchannel in an order of identification code before searching for a next frequency channel, if it is determined by the multichannel determining unit that the selected frequency channel is providing the multichannel digital broadcasting.

2. The broadcasting receiver according to claim 1, wherein the channel seek controlling unit controls the channel seeking operation such that unidirectional seek for the subchannel is performed.

3. The broadcasting receiver according to claim 1, wherein the channel seek controlling unit controls the channel seeking operation such that cyclic seek for the frequency channel is performed.

4. The broadcasting receiver according to claim 1, wherein the channel seek controlling unit searches for a next frequency channel in ascending order of the frequency and searches for a next subchannel in ascending order of the identification code if the channel seek directing unit directed tuning-up, and selects next frequency channel in descending order of the frequency and selects next subchannel in descending order of identification code if the channel seek directing means unit directed down-seeking.

5. The broadcasting receiver according to claim 1, wherein the channel seek directing means is a inputting button for transmitting direction signal in response to user operation.

6. The broadcasting receiver according to claim 1, wherein the broadcasting receiver is capable of being mounted in a mobile body.

7. A method for performing a channel seeking operation, which searches for and selects a selectable channel in a frequency range including a channel that transmits in an IBOC signal format, comprising:
   a channel seek directing step of directing to start the channel seeking operation that selects a selectable channel in an order of frequency;
   a channel seek controlling step of starting and controlling the channel seeking operation in accordance with the direction in the channel seek directing step; and
   a multichannel determining step of determining whether the selecting frequency channel is providing multichannel digital broadcasting or not,
   wherein in the channel seek controlling step, the channel seeking operation is controlled such that the next subchannel is selected in an order of identification code before searching for the next frequency channel, if it is determined in the multichannel determining step that the selecting frequency channel is providing the multichannel digital broadcasting.

8. The method according to claim 7, wherein in the channel seek controlling step, the channel seeking operation is controlled such that unidirectional seek for the subchannel is performed.

9. The method according to claim 7, wherein in the channel seek controlling step, the channel seeking operation is controlled such that cyclic seek for the frequency channel is performed.

10. The method according to claim 7, wherein in the channel seek controlling step, the channel seeking operation is controlled such that next frequency channel is searched for in ascending order of the frequency and next subchannel is searched for in ascending order of identification code if tuning-up is directed in the channel seek directing step, and next frequency channel is selected in descending order of the frequency and next subchannel is selected in descending order of identification code if down-seeking is directed in the channel seek directing step.

* * * * *